US008917144B2

(12) United States Patent
Iyomasa et al.

(10) Patent No.: US 8,917,144 B2
(45) Date of Patent: Dec. 23, 2014

(54) POWER AMPLIFIER

(71) Applicants: Kazuhiro Iyomasa, Tokyo (JP); Takayuki Matsuzuka, Tokyo (JP)

(72) Inventors: Kazuhiro Iyomasa, Tokyo (JP); Takayuki Matsuzuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 98 days.

(21) Appl. No.: 13/832,999

(22) Filed: Mar. 15, 2013

(65) Prior Publication Data
US 2014/0070890 A1 Mar. 13, 2014

(30) Foreign Application Priority Data

Sep. 11, 2012 (JP) .................................. 2012-199605

(51) Int. Cl.
H03G 3/10 (2006.01)
H03F 3/21 (2006.01)
H03F 1/02 (2006.01)
H03F 3/24 (2006.01)
H03F 3/60 (2006.01)

(52) U.S. Cl.
CPC ................. H03F 3/21 (2013.01); H03F 1/0261 (2013.01); H03F 3/245 (2013.01); H03F 3/60 (2013.01); H03F 2200/18 (2013.01); H03F 2200/411 (2013.01)
USPC ........... 330/285; 330/124 R; 330/295; 330/51

(58) Field of Classification Search
CPC .................................................... H03F 1/0261
USPC .......................................... 330/51, 285, 302
See application file for complete search history.

(56) References Cited

U.S. PATENT DOCUMENTS

| 6,121,841 | A  | * | 9/2000  | Sakuno .......................... 330/285 |
| 6,922,107 | B1 | * | 7/2005  | Green ............................ 330/296 |
| 2004/0251967 | A1 |  | 12/2004 | Moriwaki et al. |
| 2005/0077964 | A1 |  | 4/2005  | Maeda |
| 2007/0273447 | A1 |  | 11/2007 | Yamamoto et al. |
| 2010/0127689 | A1 |  | 5/2010  | Yamamoto et al. |

FOREIGN PATENT DOCUMENTS

| JP | 2004-343244 A | 12/2004 |
| JP | 2007-318463 A | 12/2007 |
| JP | 2010-124408 A | 6/2010  |
| KR | 10-0679971 B1 | 4/2005  |

OTHER PUBLICATIONS

Korean Patent Office; Office Action in Korean Patent Application No. 10-2013-0106389, dated Aug. 21, 2014.

* cited by examiner

*Primary Examiner* — Robert Pascal
*Assistant Examiner* — Khiem Nguyen
(74) *Attorney, Agent, or Firm* — Leydig, Voit & Mayer, Ltd.

(57) ABSTRACT

A power amplifier includes: an amplification element amplifying an input signal; and a bias circuit supplying a bias current to an input of the amplification element. The bias circuit includes a reference voltage terminal to which a battery voltage is applied from a battery, a first resistor having a first end connected to the reference voltage terminal, a second resistor connected between a second end of the first resistor and ground, and a first transistor. The first transistor has a control terminal connected to a connection point between the first resistor and the second resistor, a first terminal connected to a power supply, and a second terminal connected to the input of the amplification element. The first and second resistors are the same material.

4 Claims, 10 Drawing Sheets

POWER AMPLIFIER

BACKGROUND OF THE INVENTION

1. Field of the Invention

The present invention mainly relates to a power amplifier for mobile communication such as a cellular phone.

2. Background Art

GaAs-HBT power amplifiers are widely used as power amplifiers for CDMA-based cellular phones or the like (e.g., see Japanese Patent Laid-Open No. 2004-343244). Conventional power amplifiers require a reference voltage to be inputted from outside. Since this reference voltage determines an idle current of the power amplifier, the reference voltage needs to be resistant to a fluctuation in a supply voltage and be kept constant with high accuracy (e.g., on the order of 2.85 V±0.1 V).

In recent years, reference voltages are required to be generated inside power amplifiers. In this case, a reference voltage is generated inside the amplifier and the power amplifier is operated according to an enable signal (digital signal to turn ON/OFF the power amplifier) given from outside (e.g., see Japanese Patent Laid-Open No. 2010-124408).

An idle current flowing through a low output transistor during a low output operation is on the order of several mA (e.g., 2 mA to 7 mA), which is smaller than that during a medium output (e.g., on the order of 15 to 30 mA) and during a large output (e.g., on the order of up to 120 mA). The size of the emitter electrode of a transistor that determines a maximum value of output power of a low output transistor is also much smaller, for example, equal to or less than one several tenths of that of transistors used in other operating modes (e.g., the area of the emitter electrode of the low output transistor is 20 to 40 um$^2$). The size of a transistor used for a bias circuit can be much smaller (on the order of one-severalth to one-twentieth of that of the low output transistor). However, from the standpoint of constraints on a semiconductor process device and product reliability or the like, the size of the emitter electrode of a transistor is subject to a lower limit. Therefore, the size of a transistor used for a bias circuit may be slightly greater than a low output transistor (one-severalth of that of the low output transistor).

SUMMARY OF THE INVENTION

A bias circuit has a current limiting resistor that limits a current flowing from a reference voltage terminal into the bias circuit. Caused by a variation in the semiconductor process, the resistance value of the current limiting resistor fluctuates. Since the resistance value of the current limiting resistor is as high as on the order of several kΩ (e.g., 2 to 7 kΩ), a fluctuation range thereof is also large (e.g., if a fluctuation of 20% is assumed for a set value of 4000Ω, the fluctuation range is 3200 to 4800Ω). In this way, since the idle current of the amplification element fluctuates, there is a problem that the gain of the amplification element significantly fluctuates.

Furthermore, efficiency improvement in medium to low output operation (on the order of up to 18 dBm) is becoming more important recently in addition to that in high output operation (on the order of 27 dBm). This is because in urban areas where base stations are relatively densely deployed, transistors are operating mainly with medium to low output, and efficiency improvement during medium to low output operation is important for call times of cellular phone sets. Further efficiency improvement is required particularly during a low output operation. Since the circuit configuration of an RF section has already been optimized, it is necessary to reduce current consumption in a control section including the bias circuit for further improvement of efficiency.

To improve efficiency during low output operation, the reference voltage generation circuit may be stopped and current consumption may be reduced only during low output operation. However, when the reference voltage generation circuit is stopped, the reference voltage supplied to the bias circuit often becomes a battery voltage, which is directly connected to a battery. In the conventional bias circuit, when the battery voltage is applied, the idle current of the amplification element fluctuates as the battery voltage fluctuates. For example, the inventors discovered that when the amount of fluctuation of the battery voltage is 3 to 5 V, the amount of fluctuation of the idle current set to 3 mA at 3.4 V would reach 6 mA. This fluctuation of the idle current caused by the fluctuation of the battery voltage is also a problem.

In view of the above-described problems, an object of the present invention is to provide a power amplifier which can suppress a fluctuation in the idle current caused by a variation in the semiconductor process.

According to the present invention, a power amplifier comprises: an amplification element amplifying an input signal; and a bias circuit supplying a bias current to an input of the amplification element, wherein the bias circuit includes a reference voltage terminal to which a battery voltage is applied from a battery, a first resistor having a first end connected to the reference voltage terminal, a second resistor connected between a second end of the first resistor and ground, and a first transistor, the first transistor has a control terminal connected to a connection point between the first resistor and the second resistor, a first terminal connected to a power supply, and a second terminal connected to the input of the amplification element, and the first and second resistors are made of same material.

The present invention makes it possible to suppress a fluctuation in the idle current caused by a variation in the semiconductor process.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
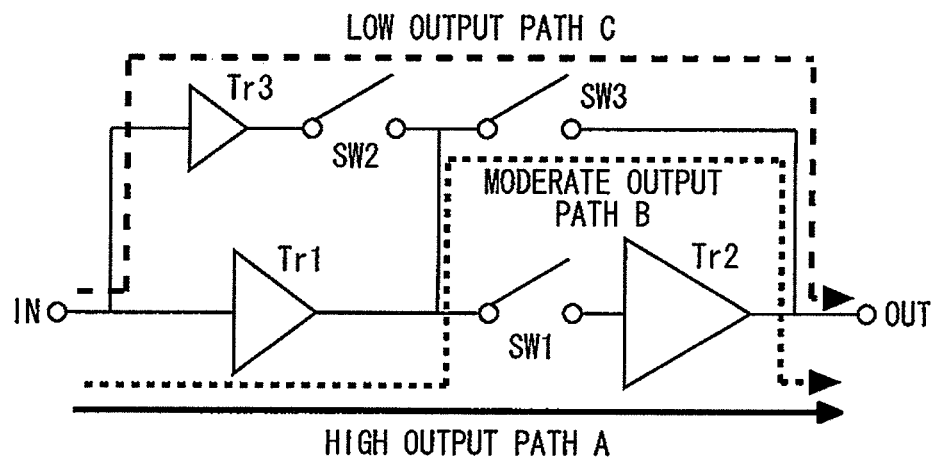
FIG. 1 is a block diagram illustrating a power amplifier according to a first embodiment of the present invention.
Figure 1:
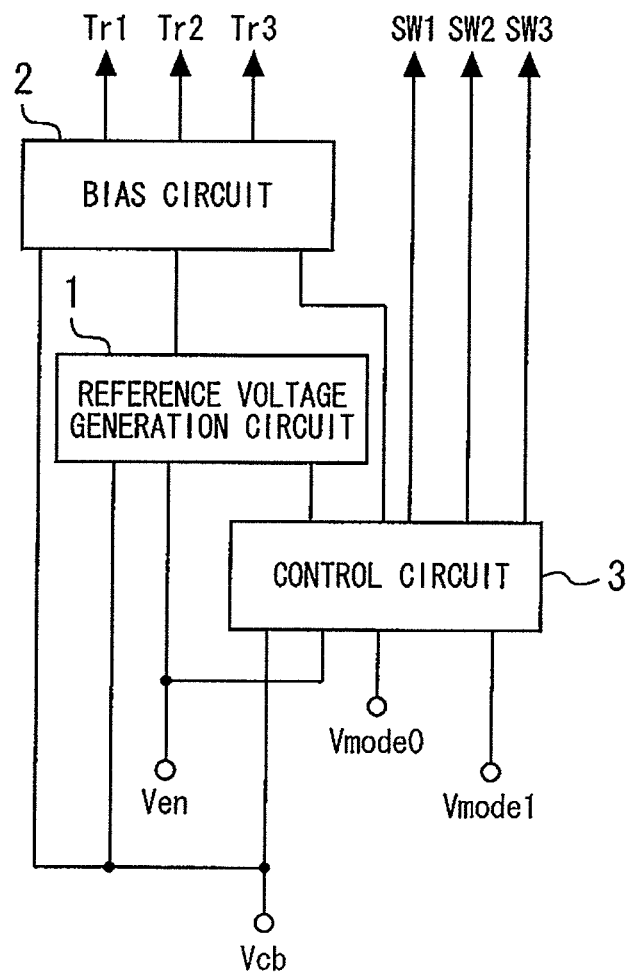

FIG. 1 is a block diagram illustrating a power amplifier according to a first embodiment of the present invention. This power amplifier is formed by a BiFET process through which an HBT and an FET are formed on the same substrate.

An amplification element Tr1 amplifies an input signal inputted from outside. An amplification element Tr2 amplifies the output signal of the amplification element Tr1. An amplification element Tr3 amplifies an input signal. A switch SW1 is connected between the output of the amplification element Tr1 and the input of the amplification element Tr2. A switch SW2 is connected between the output of the amplification element Tr1 and the output of the amplification element Tr3. A switch SW3 is connected between the output of the amplification element Tr1 and the output of the amplification element Tr2.

The reference voltage generation circuit 1 generates a reference voltage. A bias circuit 2 supplies a bias current to the inputs of the Tr1, Tr2 and Tr3 based on the reference voltage. A control circuit 3 controls the SW1, SW2 and SW3, and the reference voltage generation circuit 1. The reference voltage generation circuit 1 and the bias circuit 2 are integrated on the same GaAs chip using a GaAs-based BiFET (HBT+FET) process.

Next, operation of the power amplifier according to the present embodiment will be described. When a high power output of 17 dBm or higher is obtained, the control circuit 3 turns ON the SW1 and turns OFF the SW2 and SW3, which enables a high output path A. The Tr3 is turned OFF. The Tr1 amplifies the signal inputted to an input terminal IN, the Tr2 amplifies the output signal of the Tr1 and causes the amplified signal to be outputted from an output terminal OUT.

When a moderate power output of 7 to 17 dBm is obtained, the control circuit 3 turns OFF the SW1 and SW2 and turns ON the SW3, which enables a moderate output path B. The Tr2 and the Tr3 are turned OFF. The Tr1 amplifies the signal inputted to the input terminal IN and causes the amplified signal to be outputted from the output terminal OUT.

When a small power output of 7 dBm or less is obtained, the control circuit 3 turns OFF the SW1 and turns ON the SW2 and the SW3, which enables a low output path C. The Tr1 and the Tr2 are turned OFF. The Tr3 amplifies a signal inputted to the input terminal IN and causes the amplified signal to be outputted from the output terminal OUT. Furthermore, as a feature of the present embodiment, the control circuit 3 stops the reference voltage generation circuit 1 during this low output operation.

Figure 2:
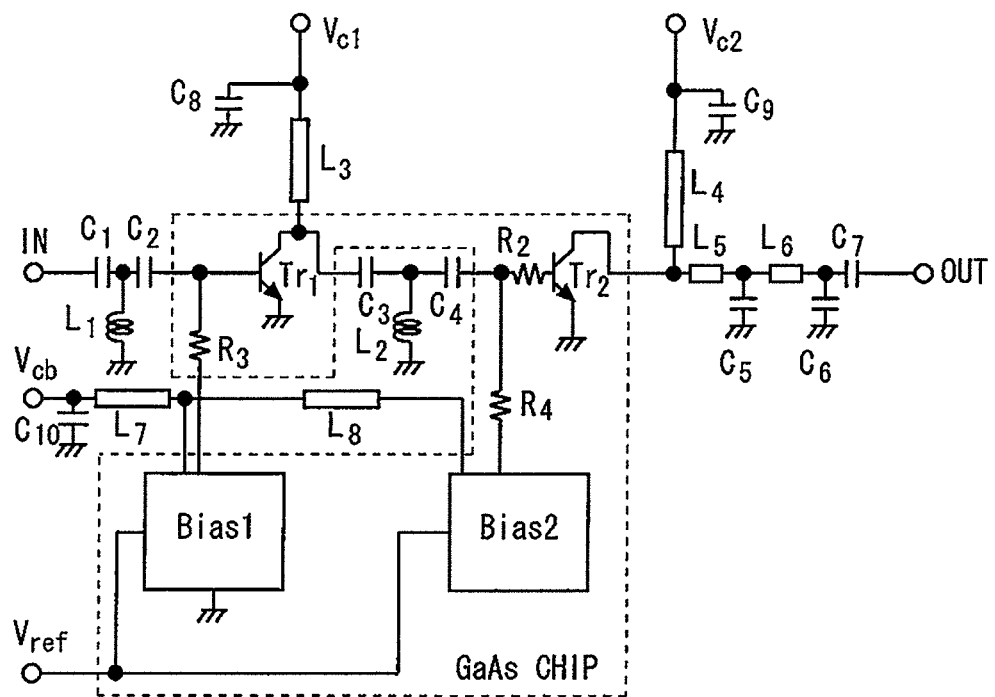
FIG. 2 is a circuit diagram illustrating part of the power amplifier according to the first embodiment of the present invention.

FIG. 2 is a circuit diagram illustrating part of the power amplifier according to the first embodiment of the present invention. The Tr3, SW1, SW2 and SW3 or the like are omitted. A GaAs-HBT power amplifier and a bias circuit are integrated on the same GaAs chip. The portion enclosed by a dotted-line frame is the GaAs chip and the circuit elements outside the dotted-line frame are formed on a module substrate using chip parts and lines.

The Tr1 which is a first-stage amplification element that amplifies the input signal and the Tr2 which is a post-stage amplification element that amplifies the output signal of the Tr1 are formed on the same GaAs substrate. The Tr1 and the Tr2 are GaAs-HBTs (heterojunction bipolar transistors). The input signal is inputted to the base of the Tr1, a collector voltage is applied to the collector and the emitter is grounded. Bias 1 is a first-stage bias circuit that supplies a bias current to the base of the Tr1, and Bias2 is a post-stage bias circuit that supplies a bias current to the base of the Tr2.

IN is an RF signal input terminal, OUT is an RF output signal terminal, R2 to R4 are resistors, C1 to C10 are capacitors, and L1 and L2 are inductors. L3 to L8 are lines having specific electric lengths and act as inductors. Vc is a collector power supply terminal, Vc1 is a collector power supply terminal for the Tr1, Vc2 is a collector power supply terminal for the Tr2, Vcb is a power supply terminal of the Bias1 and Bias2, and Vref is a terminal that applies a reference voltage to the Bias1 and Bias2.

Figure 3:
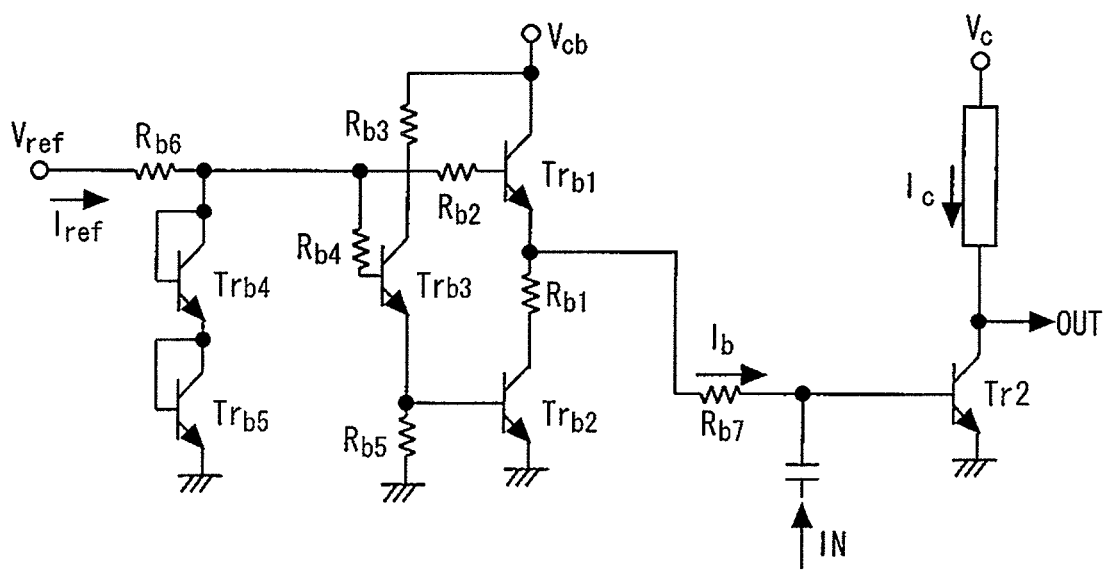
FIG. 3 is a circuit diagram illustrating the bias circuit for the Tr2 according to the first embodiment of the present invention.

FIG. 3 is a circuit diagram illustrating the bias circuit for the Tr2 according to the first embodiment of the present invention. This circuit is an emitter-follower type bias circuit corresponding to the bias circuit Bias2 for the Tr2. The same applies to the configuration of the bias circuit Bias1 for the Tr1. Vref is a terminal to which a reference voltage is applied, Trb1 to Trb5 are GaAs-HBTs, and Rb1 to Rb7 are resistors. This bias circuit operates so as to keep idle currents of the Tr1 and Tr2 constant with respect to a temperature variation. Here, the "idle current" refers to a bias current of the power amplifier without RF input power.

Figure 4:
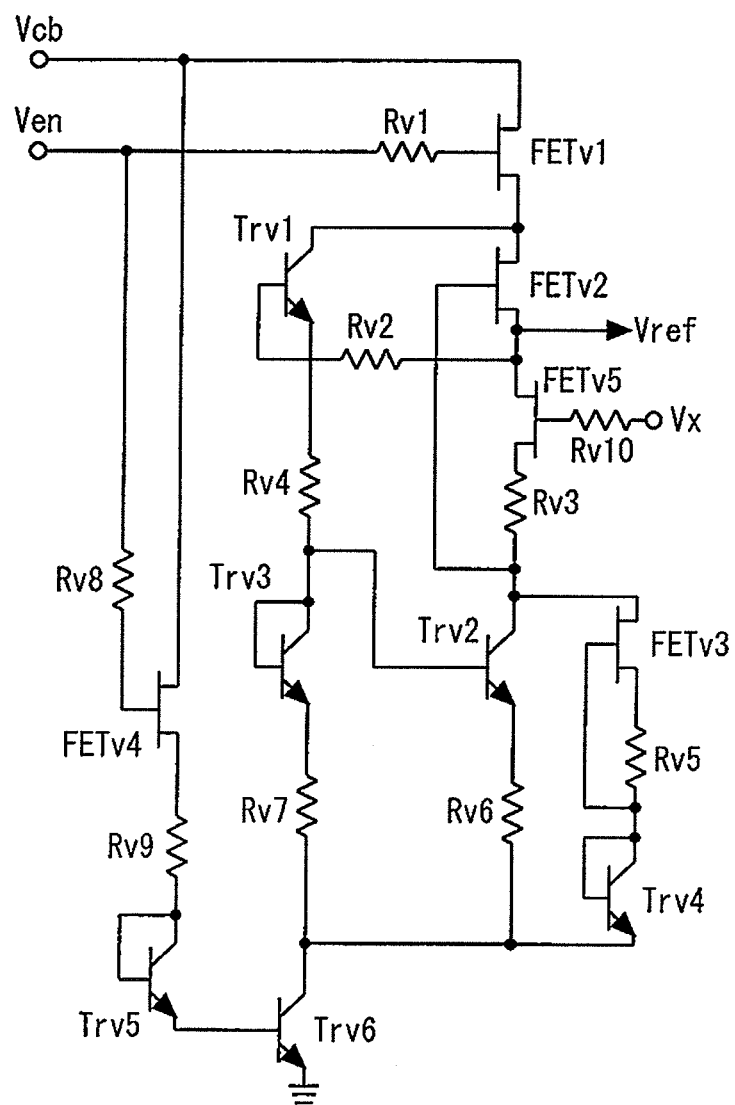
FIG. 4 is a circuit diagram illustrating the reference voltage generation circuit according to the first embodiment of the present invention.

FIG. 4 is a circuit diagram illustrating the reference voltage generation circuit according to the first embodiment of the present invention. FETv1 to FETv4 are depression mode FETs, Trv1 to Trv6 are HBTs, Rv1 to Rv9 are resistors, Vcb is a power supply terminal, Ven is an enable terminal to which an enable voltage is applied, and Vref is an output terminal from which a reference voltage is outputted. Vx is a signal terminal for controlling an FETv5.

The gate of the FETv1 is connected to the terminal Ven via the Rv1, the drain of the FETv1 is connected to the power supply terminal Vcb. The drain of the FETv2 is connected to the source of the FETv1. One end of the Rv2 is connected to the source of the FETv2 and the other end of the Rv2 is connected to the base of the Trv1. The collector of the Trv1 is connected to the source of the FETv1. One end of the Rv3 is connected to the gate of the FETv2 and the collector of the Trv2. The base of the Trv2 is connected to the emitter of the Trv1 via the Rv4. The base and the collector of the Trv3 are connected to the base of the Trv2 and an Rv4. The Rv6 is connected between the emitter of the Trv2 and the collector of the Trv6. The Rv7 is connected between the emitter of the Trv3 and the collector of the Trv6. This reference voltage generation circuit outputs a source voltage of the FETv2 from the output terminal Vref as a reference voltage.

The FETv3, Rv5 and Trv4 constitute a circuit that compensates for a variation in a threshold voltage of the FETv2 which is a depression mode FET. The drain of the FETv3 is connected to one end of the Rv3 and the collector of the Trv2. The base and the collector of the Trv4 are connected to the gate of the FETv3 and also connected to the source of the FETv3 via the Rv5. The emitter of the Trv4 is connected to the collector of the Trv6. The resistor Rv5 may be omitted depending on the design.

The FETv4, Trv5, Trv6, Rv8 and Rv9 constitute a circuit that prevents leakage. The gate of the FETv4 is connected to the terminal Ven via the Rv8, the drain is connected to the power supply terminal Vcb, and the source is connected to the base and collector of the Trv5 via the Rv9. The emitter of the Trv5 is connected to the base of the Trv6 and the emitter of the Trv6 is grounded.

The switch FETv5 is connected between the output terminal Vref and the Rv3. That is, the FETv5 is connected between the output terminal Vref and ground. The gate of the FETv5 is connected to the control circuit 3 via the Rv10 and the terminal Vx. The control circuit 3 controls ON/OFF of the FETv5.

Next, operation of the reference voltage generation circuit 1 will be described. When a High level (reference voltage) control signal is inputted from the control circuit 3 to the terminal Vx, the FETv5 turns ON, and therefore the reference voltage generation circuit 1 performs normal operation. On the other hand, when a Low level (approximately 0.3 V or below) control signal is inputted from the control circuit 3 to the terminal Vx, the FETv5 turns OFF, which prevents the drain current of the FETv2 from flowing. Furthermore, since the reference voltage falls compared to that during operation, the collector current of the Trv1 also ceases to flow. That is, no current flows from the power supply terminal Vcb into the reference voltage generation circuit 1, causing the reference voltage generation circuit 1 to stop.

Figure 5:
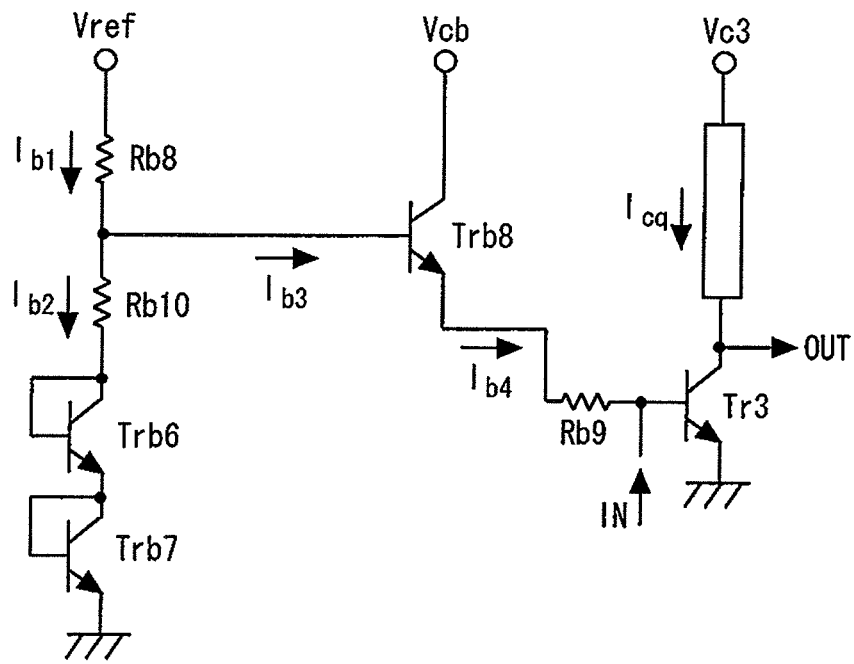
FIG. 5 is a circuit diagram illustrating the bias circuit for the Tr3 according to the first embodiment of the present invention.

FIG. 5 is a circuit diagram illustrating the bias circuit for the Tr3 according to the first embodiment of the present invention. Trb6 to Trb8 are HBTs, Rb8 to Rb10 are resistors, Vcb is a power supply terminal, Vref is a reference voltage terminal, and Vc3 is a collector power supply terminal for the Tr3. The reference voltage terminal Vref of the bias circuit for the Tr3 is always directly connected to a battery and a battery voltage is applied thereto from a battery.

One end of the Rb8 is connected to the reference voltage terminal Vref. The Rb10 and diode-connected Trb6 and Trb7 are connected in series between the other end of this Rb8 and ground. The base of the Trb8 is connected to the connection point between the Rb8 and Rb10, the collector is connected to the power supply and the emitter is connected to the input of the Tr3 for low output operation via the Rb9.

This bias circuit is an emitter-follower type and the Trb8 is an emitter-follower transistor. The Rb8 is a current limiting resistor that limits a current that flows from the reference voltage terminal Vref into the bias circuit. The diode-connected Trb6 and Trb7 function as a constant voltage circuit that stabilizes the base potential of the Trb8.

The Rb8 and Rb10 are thin-film resistors of NiCr and TaSiN or the like or semiconductor resistors such as base layers, and both resistors are made of the same material. Although there is a distribution of element characteristics within the wafer surface caused by a variation in the semiconductor process, the resistance value uniformly fluctuates in the same chip. Therefore, fluctuations in the resistance values of the Rb8 and Rb10 are the same with respect to a variation in the semiconductor process.

Next, the current flowing through the bias circuit for the Tr3 will be described. A current Ib1 flows into the Rb8 from the reference voltage terminal Vref. Of the current Ib1, a current Ib2 flows into the ground through the Rb10, Trb6 and Trb7, and a current Ib3 becomes a base current of the Trb8. A current Ib4 outputted from the Trb8 becomes a base current of the Tr3. An idle current Icq flows into the Tr3. Assuming that a current amplification factor of the Trb8 is $\beta1$ and a current amplification factor of the Tr3 is $\beta2$, the relationships among these currents are as follows.

$$Ib1 = Ib2 + Ib3 \quad \text{(Equation 1)}$$

$$Ib4 = \beta1 \times Ib3 \quad \text{(Equation 2)}$$

$$Icq = \beta2 \times Ib4 \quad \text{(Equation 3)}$$

Figure 6:
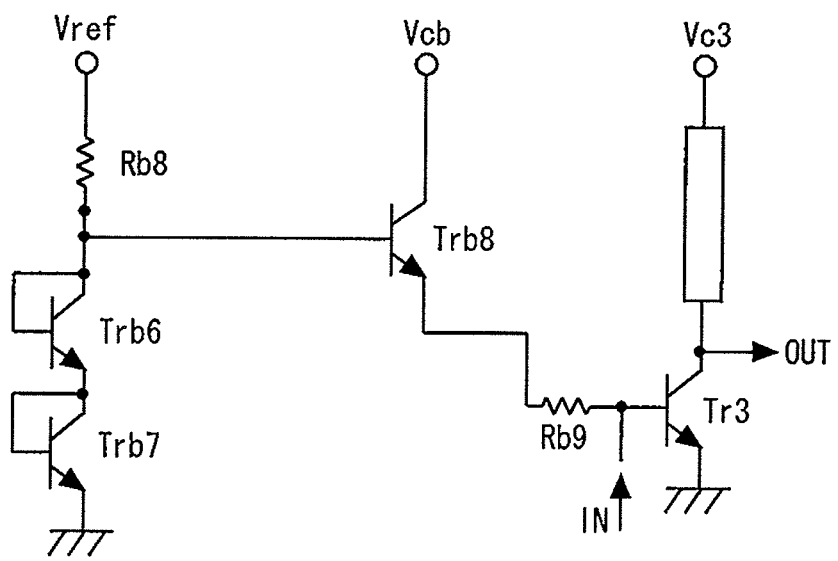
FIG. 6 is a circuit diagram illustrating a bias circuit according to a comparative example.

Next, effects of the present embodiment will be described in comparison with a comparative example. FIG. 6 is a circuit diagram illustrating a bias circuit according to a comparative example. The comparative example is different from the first embodiment in that there is no Rb10.

When the resistance values of the Rb8 and Rb10 increase due to a variation in the semiconductor process, according to the comparative example, the Ib1 decreases, the Ib3 decreases and the idle current Icq of the Tr3 decreases. On the other hand, according to the first embodiment, the resistance value of the Rb10 also increases, the Ib2 decreases and the Ib3 increases, and it is thereby possible to suppress the decrease of the idle current Icq.

On the contrary, when the resistance values of the Rb8 and Rb10 decrease, according to the comparative example, the Ib1 increases and the idle current Icq increases. On the other hand, according to the first embodiment, the resistance value of the Rb10 also decreases, the Ib2 increases and the Ib3 decreases, and it is thereby possible to suppress the increase of the idle current Icq.

Figure 7:
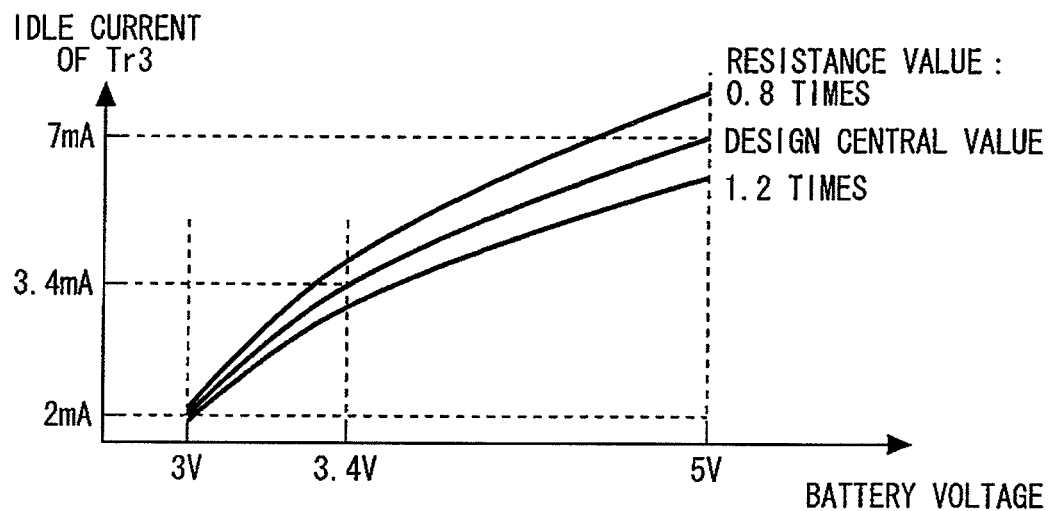
FIG. 7 is a diagram illustrating an idle current of the Tr3 with respect to the battery voltage in the comparative example.

FIG. 7 is a diagram illustrating an idle current of the Tr3 with respect to the battery voltage in the comparative example. When a battery voltage is connected to the reference voltage terminal Vref in the comparative example, if the battery voltage fluctuates within a range of 3 to 5 V, the idle current of the Tr3 set to 3.4 mA at 3.4 V fluctuates within a range of 2 to 7 mA. Furthermore, when the resistance values of the Rb8 and Rb10 become 0.8 times their design values due to a variation in the semiconductor process, the idle current increases by 19 to 16% with respect to its design central value (idle current of the Tr3 when the resistance values of the Rb8 and Rb10 are design values), and when the resistance value becomes 1.2 times the design value, the idle current decreases by 14 to 12%.

Figure 8:
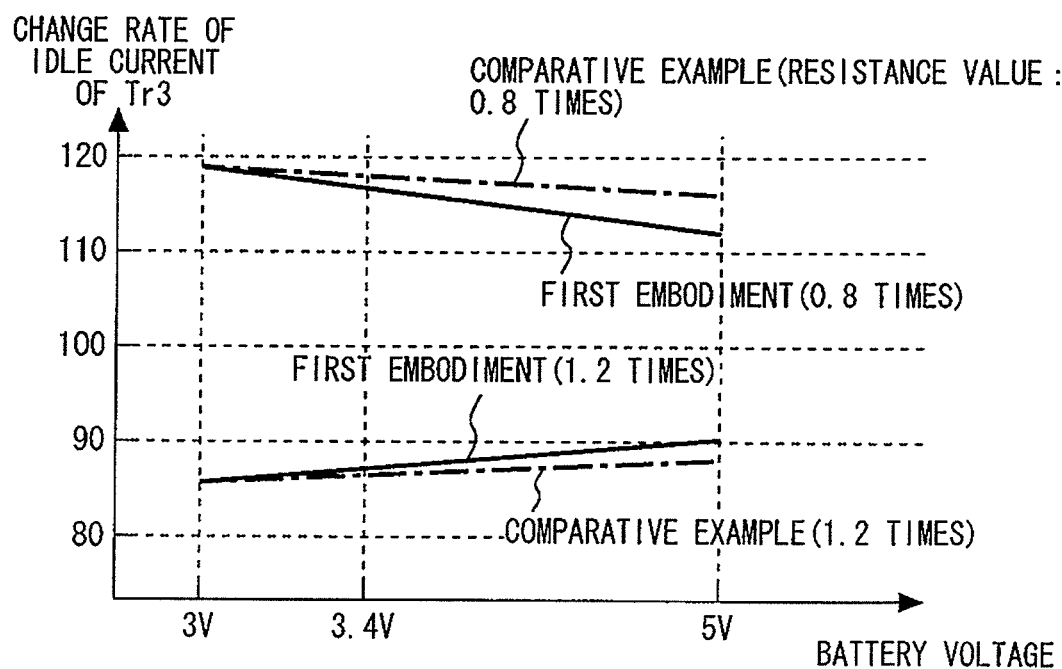
FIG. 8 is a diagram illustrating a change rate of the idle current of the Tr3 with respect to the battery voltage in the first embodiment and the comparative example.

FIG. 8 is a diagram illustrating a change rate of the idle current of the Tr3 with respect to the battery voltage in the first embodiment and the comparative example. The vertical axis shows an idle current standardized assuming the design central value is 100 and the horizontal axis shows a battery voltage. The resistance values of the Rb8 and Rb10 fluctuate by ±20% from the design values. In the first embodiment, the fluctuation in the idle current from the design value is smaller than in the comparative example. In the first embodiment, when resistance value of the Rb8 or Rb10 is 0.8 times the design value, the idle current increases by 19 to 12% from the design central value, and when the resistance value becomes 1.2 times the design value, the idle current decreases by 14 to 9%. Therefore, in the first embodiment, the fluctuation in the idle current decreases by 2 to 3% from the design value compared to the comparative example. Thus, the present embodiment can suppress a fluctuation in the idle current caused by a variation in the semiconductor process.

Furthermore, the constant voltage circuit made up of the diode-connected Trb6 and Trb7 also has a temperature characteristic, but by connecting the Rb10 in series to this constant voltage circuit, it is possible to reduce (suppress) the variation in the idle current associated with the temperature characteristic. That is, since the connection of the Rb10 causes the voltage applied between the diodes of the constant voltage circuit to reduce, the operation point of the diode is set in a direction in which the current is reduced and the variation in the current Ib2 flowing through the constant voltage circuit decreases with respect to a temperature variation compared to the comparative example. For this reason, the variation in the base current Ib3 also decreases and the variation in idle current can be suppressed. Furthermore, using a material having a temperature characteristic for the Rb8 and Rb10 also allows the temperature characteristic to be controlled.

Furthermore, when the resistance value of the Rb10 is smaller than 50Ω, the effect of suppressing a variation decreases and when the resistance value is greater than 500Ω, the variation in the idle current increases with respect to the voltage fluctuation of the reference voltage. For example, when the resistance value is high, the idle current is 2 mA when the reference voltage is 3.0 V, and on the order of 9 mA when the reference voltage is 5 V, and the variation in the idle current is 7 mA. For this reason, the resistance value of the Rb10 is preferably 50Ω or more and 500Ω or less.

Second Embodiment

Figure 9:
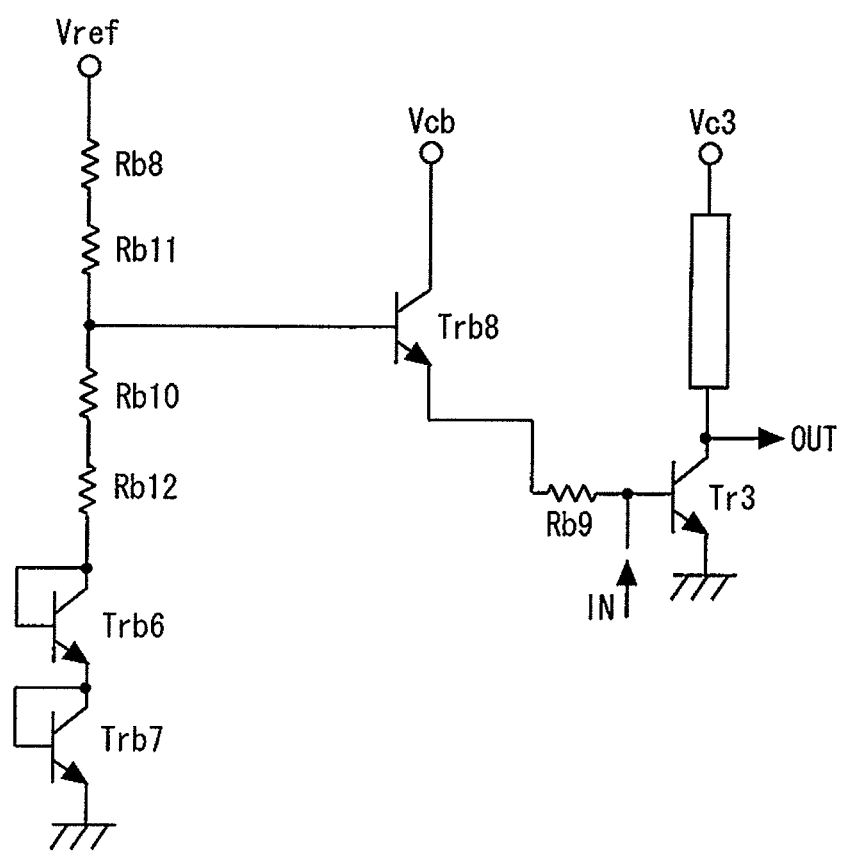
FIG. 9 is a circuit diagram illustrating a bias circuit for the Tr3 according to a second embodiment of the present invention.

FIG. 9 is a circuit diagram illustrating a bias circuit for the Tr3 according to a second embodiment of the present invention. In addition to the configuration in the first embodiment, a resistor Rb11 is connected in series to the Rb8 and a resistor Rb12 is connected in series to the Rb10. The Rb11 and Rb12 are thin-film resistors of NiCr, TaSiN or the like or semiconductor resistors of base layers or the like. However, the Rb8 and Rb10, and Rb11 and Rb12 have different temperature coefficients. For example, the temperature coefficient of a NiCr thin-film resistor is substantially flat, the temperature coefficient of a TaSiN thin-film resistor is negative (resistance value decreases as the temperature increases), and the temperature coefficient of a resistor using a base layer is positive (resistance value increases as the temperature increases). Thus, by combining resistors having different temperature coefficients, it is possible to control temperature characteristics of the current value of the constant current source, and thereby control temperature characteristics of the idle current of the Tr3 as well.

Third Embodiment

Figure 10:
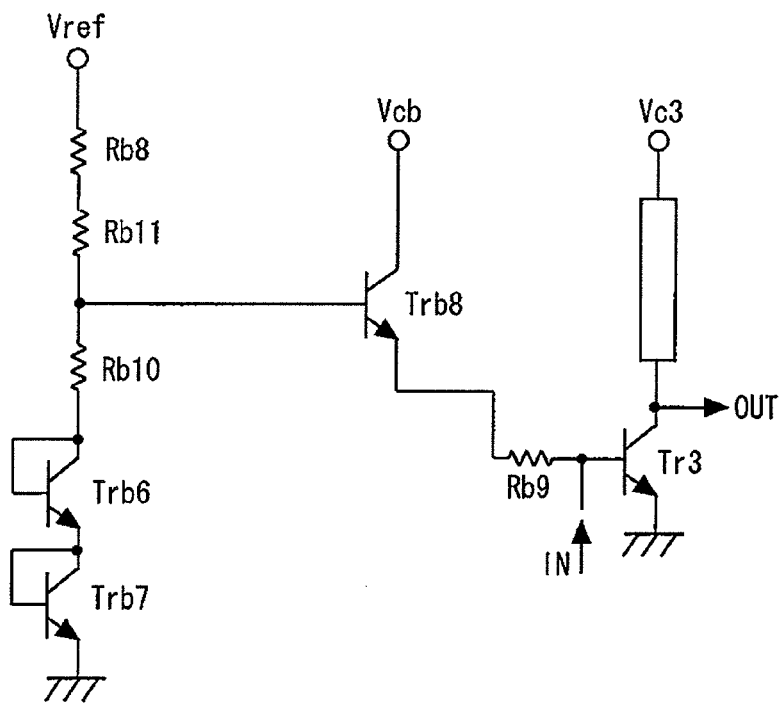
FIG. 10 is a circuit diagram illustrating a bias circuit for the Tr3 according to a third embodiment of the present invention.

FIG. 10 is a circuit diagram illustrating a bias circuit for the Tr3 according to a third embodiment of the present invention. In addition to the configuration of the first embodiment, a resistor Rb11 is connected in series to the Rb8. This Rb11 is a thin-film resistor of NiCr, TaSiN or the like or a semiconductor resistor of a base layer or the like. However, the Rb8, Rb10 and Rb11 have different temperature coefficients. Thus, by combining resistors having different temperature coefficients, it is possible to control temperature characteristics of the current value of the constant current source, and thereby control temperature characteristics of the idle current of the Tr3 as well.

Fourth Embodiment

Figure 11:
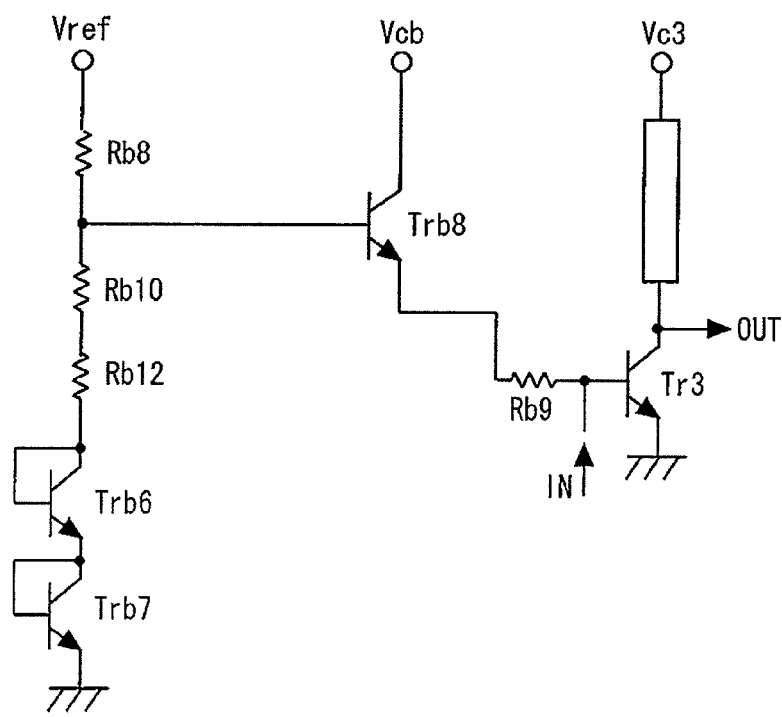
FIG. 11 is a circuit diagram illustrating a bias circuit for the Tr3 according to a fourth embodiment of the present invention.

FIG. 11 is a circuit diagram illustrating a bias circuit for the Tr3 according to a fourth embodiment of the present invention. In addition to the configuration of the first embodiment, a resistor Rb12 is connected in series to the Rb10. This Rb12 is a thin-film resistor of NiCr, TaSiN or the like or a semiconductor resistor of a base layer or the like. However, the Rb8, Rb10 and Rb12 have different temperature coefficients. Thus, by combining resistors having different temperature coefficients, it is possible to control temperature characteristics of the current value of the constant current source, and thereby control temperature characteristics of the idle current of the Tr3 as well.

Fifth Embodiment

Figure 12:
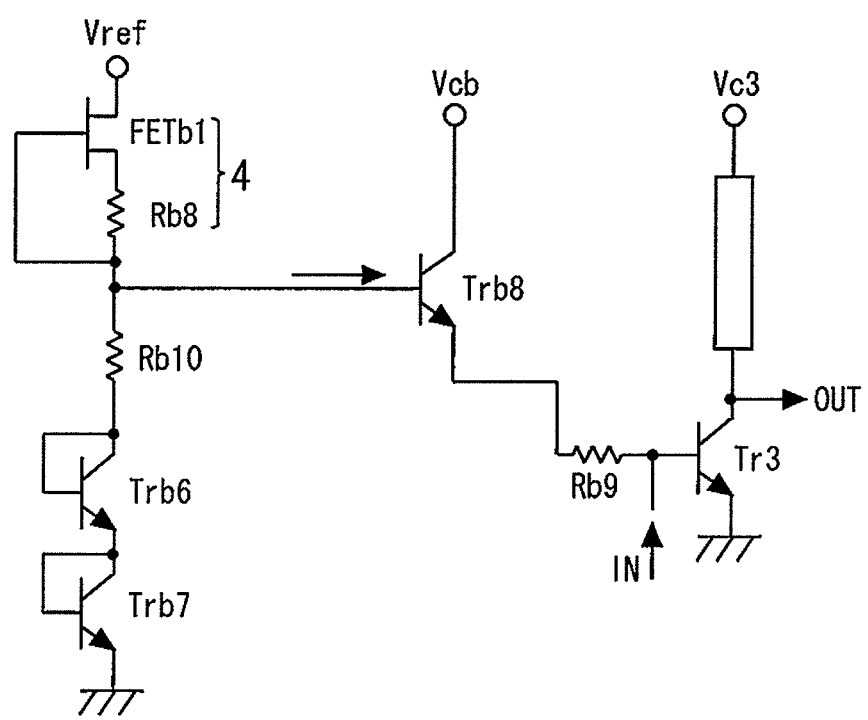
FIG. 12 is a circuit diagram illustrating a bias circuit for the Tr3 according to a fifth embodiment of the present invention.

FIG. 12 is a circuit diagram illustrating a bias circuit for the Tr3 according to a fifth embodiment of the present invention. An FETb1, which is a depression mode FET, is added to the configuration of the first embodiment. The source of the FETb1 is connected to the reference voltage terminal Vref, the drain is connected to one end of the Rb8 and the gate is connected to the other end of the Rb8. The FETb1 and the Rb8 constitute a constant current source 4. This constant current source 4 generates a constant current from a voltage applied to the reference voltage terminal Vref. The Trb8 and the Rb9 generate a bias current from the output current of this constant current source 4 and supply the bias current to the base of the Tr3.

Figure 13:
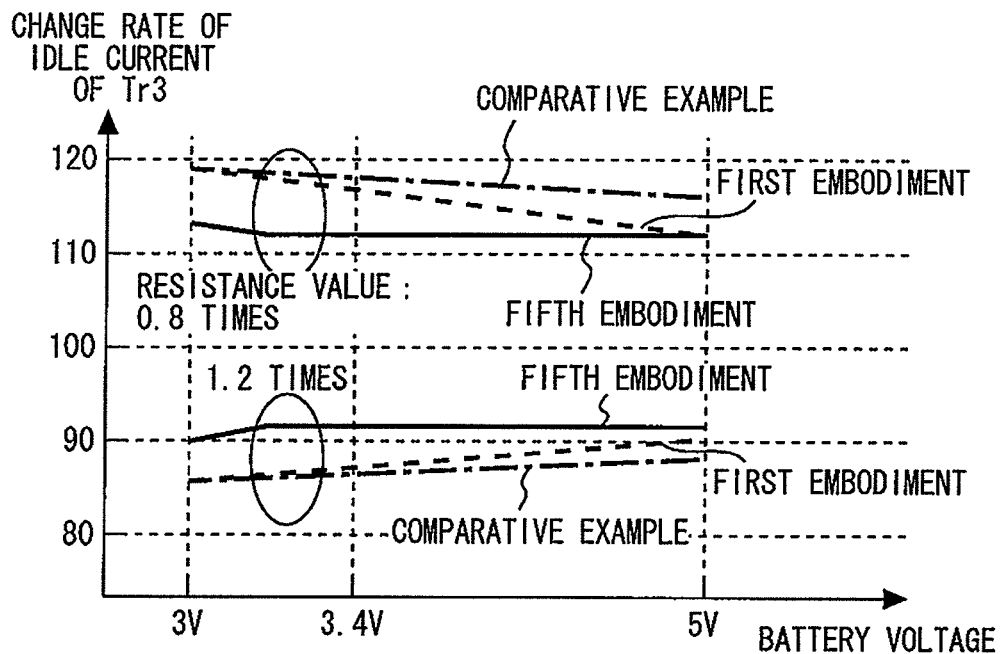
FIG. 13 is a diagram illustrating a change rate of the idle current of the Tr3 with respect to the battery voltage according to the first and fifth embodiments, and the comparative example.

Next, effects of the present embodiment will be described in comparison with the first embodiment and the comparative example. FIG. 13 is a diagram illustrating a change rate of the idle current of the Tr3 with respect to the battery voltage according to the first and fifth embodiments, and the comparative example. Since the first embodiment and the comparative example do not include the constant current source 4, when the battery voltage is applied to the reference voltage terminal Vref, the idle current of the Tr3 fluctuates due to a fluctuation in the battery voltage. On the other hand, in the present embodiment, even when the battery voltage fluctuates, the output current of the constant current source 4 (base current of the Trb8) does not fluctuate if the battery voltage is sufficiently high. For this reason, it is possible to suppress a fluctuation in the idle current of the Tr3 caused by a fluctuation in the battery voltage. As a result, it is also possible to suppress a gain fluctuation caused by a fluctuation in the battery voltage. To be more specific, the battery voltage may be 3.4 V or higher. If the battery voltage is lower than 3.4 V, the output current of the constant current source neither sufficiently increases nor becomes constant, causing the gain of the idle current to slightly fluctuate.

Furthermore, when the resistance value of the Rb8 or Rb10 becomes 0.8 times the design value due to a variation in the semiconductor process, in the present embodiment, the idle current increases by on the order of 13 to 12% from the design central value and when the resistance value becomes 1.2 times the design value, the idle current decreases by on the order of 10 to 9%. Therefore, it is possible to suppress a fluctuation in the idle current due to a variation in the semiconductor process compared to the comparative example.

Figure 14:
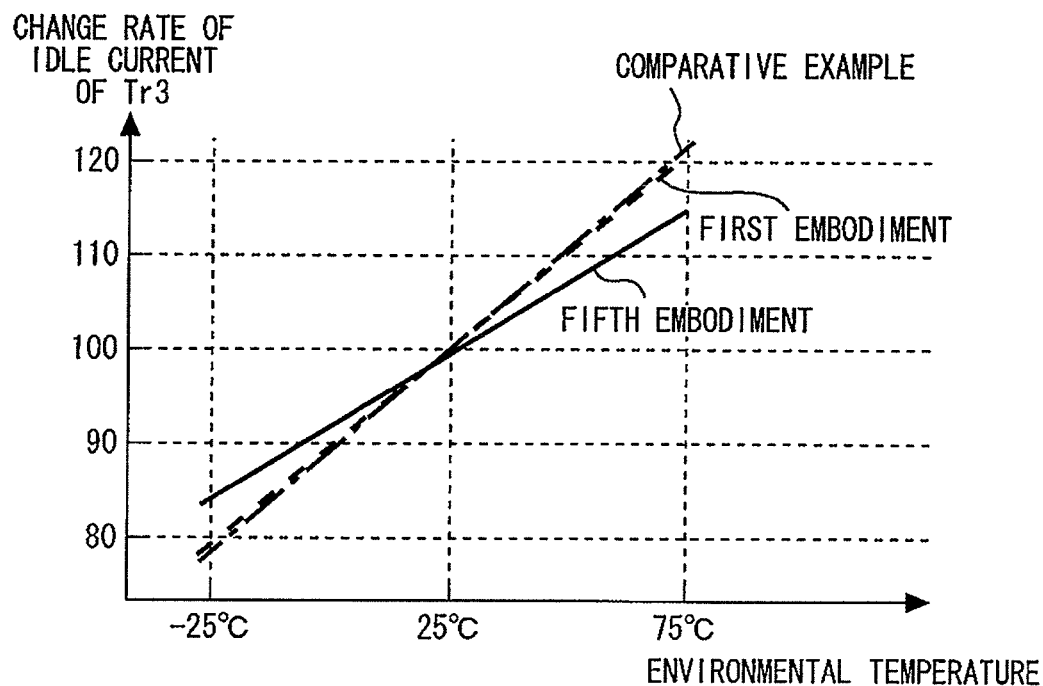
FIG. 14 is a diagram illustrating a change rate of the idle current of the Tr3 with respect to an environmental temperature according to the first and fifth embodiments, and the comparative example.

FIG. 14 is a diagram illustrating a change rate of the idle current of the Tr3 with respect to an environmental temperature according to the first and fifth embodiments, and the comparative example. The reference voltage is 3.4 V, the vertical axis shows an idle current standardized assuming that a current at a normal temperature (25° C.) is 100 and the horizontal axis shows an environmental temperature.

In the comparative example, the current changes by approximately 22% at a high temperature (75° C.) compared to a normal temperature and the current changes by 22% at a low temperature (−25° C.). In the first embodiment, the variation is 21% at a high temperature and on the order of 21% at a low temperature, while in the fifth embodiment, the variation is 12% at a high temperature and 15% at a low temperature. Therefore, the fifth embodiment can suppress a variation in the idle current with respect to a temperature variation compared to the comparative example and the first embodiment.

Sixth Embodiment

Figure 15:
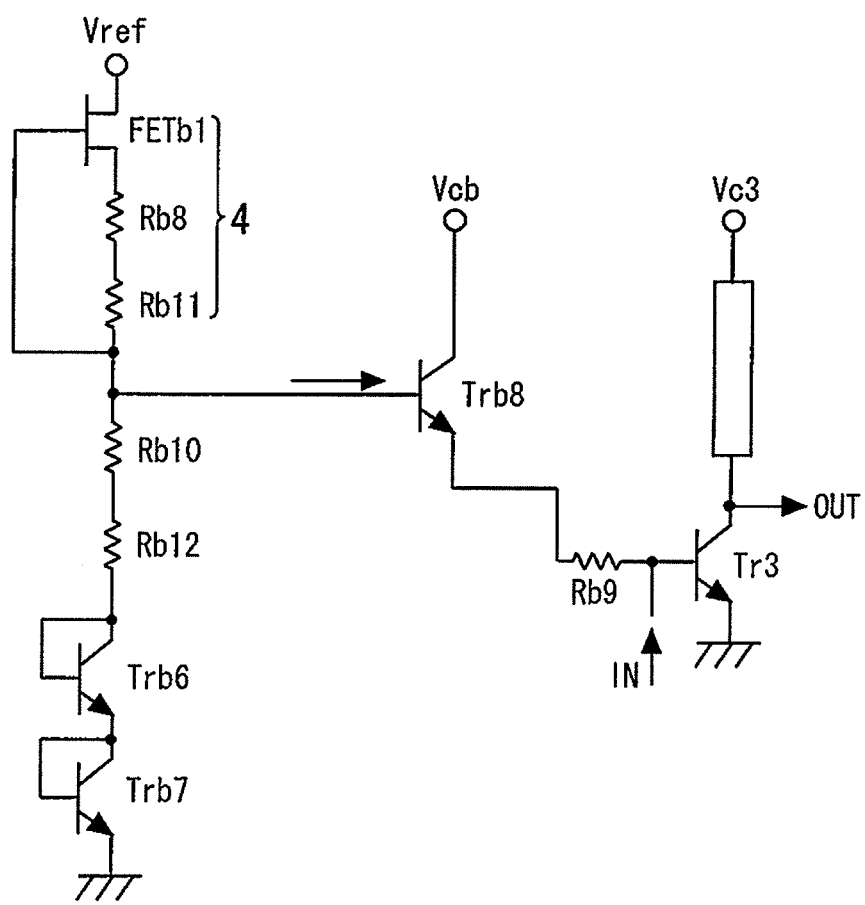
FIG. 15 is a circuit diagram illustrating a bias circuit for the Tr3 according to a sixth embodiment of the present invention.

FIG. 15 is a circuit diagram illustrating a bias circuit for the Tr3 according to a sixth embodiment of the present invention. In addition to the configuration of the fifth embodiment, a resistor Rb11 is connected in series to the Rb8 and a resistor Rb12 is connected in series to the Rb10. The Rb11 and Rb12 are thin-film resistors of NiCr, TaSiN or the like or semiconductor resistors of base layers or the like. However, the Rb8 and Rb10, and Rb11 and Rb12 have different temperature coefficients. Thus, by combining resistors having different temperature coefficients, it is possible to control temperature characteristics of the current value of the constant current source, and thereby control temperature characteristics of the idle current of the Tr3 as well.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-199605, filed on Sep. 11, 2012, including specification, claims, drawings, and summary, on which the Convention priority of the present application is based, is incorporated herein by reference in its entirety.

What is claimed is:

1. A power amplifier comprising:
a first amplification element amplifying an input signal;
a second amplification element amplifying an output signal of the first amplification element;
a third amplification element amplifying the input signal;
a first switch connected between an output of the first amplification element and an input of the second amplification element;
a second switch connected between the output of the first amplification element and an output of the third amplification element;
a third switch connected between the output of the first amplification element and an output of the second amplification element;
a reference voltage generation circuit generating a reference voltage;
a bias circuit supplying a bias current to inputs of the first, second, and third amplification elements based on the reference voltage; and
a control circuit controlling the first, second, and third amplification elements and the reference voltage generation circuit, wherein
the control circuit stops the reference voltage generation circuit, when the control circuit turns OFF the first amplification element and turns ON the second and third amplification elements, and
the bias circuit includes a reference voltage terminal to which a battery voltage is applied from a battery, a first resistor having a first end connected to the reference voltage terminal, a second resistor connected between a second end of the first resistor and ground, and a first transistor, wherein
the first transistor has a control terminal connected to a connection point between the first resistor and the second resistor, a first terminal connected to a power supply, and a second terminal connected to the input of the amplification element, and
the first and second resistors are the same material.

2. The power amplifier according to claim 1, wherein the bias circuit includes a diode connected in series with the second resistor, between the second end of the first resistor and the ground.

3. The power amplifier according to claim 1, wherein the bias circuit includes a third resistor connected in series with at least one of the first and second resistors and having a temperature coefficient that differs from temperature coefficients of the first and second resistors.

4. The power amplifier according to claim 1, wherein the bias circuit includes
a first internal terminal connected to the reference voltage terminal,
a second internal terminal connected to the first end of the first resistor, and
a second transistor having a first transistor terminal connected to the first internal terminal, a second transistor terminal connected to the second internal terminal, and a control terminal connected to the second end of the first resistor.

* * * * *